United States Patent [19]

Gooding et al.

[11] Patent Number: 5,291,069
[45] Date of Patent: Mar. 1, 1994

[54] BIPOLAR H WRITE DRIVER

[75] Inventors: Gary F. Gooding; Larry L. Tretter, both of Tucson, Ariz.

[73] Assignee: International Business Machines Corporation, Armonk, N.Y.

[21] Appl. No.: 991,864

[22] Filed: Dec. 15, 1992

[51] Int. Cl.$^5$ .................. H03K 17/60; H03K 3/01
[52] U.S. Cl. .................. 307/254; 307/296.6; 307/296.7; 307/315; 307/570
[58] Field of Search .................. 307/253–254, 307/296.6–296.7, 315, 570

[56] References Cited

U.S. PATENT DOCUMENTS

| | | | |
|---|---|---|---|
| 4,146,801 | 3/1979 | Vali et al. | 307/254 |
| 4,496,849 | 1/1985 | Kotowski | 307/254 |
| 4,551,772 | 11/1985 | Sliger | 360/46 |
| 4,639,794 | 1/1987 | Ferrier | 360/46 |
| 4,701,635 | 10/1987 | Kawazoe et al. | 307/270 |
| 4,777,386 | 10/1988 | Majumdar | 307/270 |
| 4,985,666 | 1/1991 | Nakabayashi | 318/434 |
| 5,059,824 | 10/1991 | Ueno | 307/446 |

FOREIGN PATENT DOCUMENTS 0788380 12/1980 U.S.S.R. .................. 307/254

OTHER PUBLICATIONS

IBM TDB, vol. 16 No. 8 Jan., 1974 Power Amplifier Providing Low-Power Dissipation in a Variable Speed Reel-To-Reel Tape Transport pp. 2621-2623.
IBM TDB vol. 23, No. 11 Apr. 1981 "Predriver For H Configured Write Driver For Magnetic Recording" pp. 5167-5168.

*Primary Examiner*—Margaret R. Wambach
*Attorney, Agent, or Firm*—William J. Benman, Jr.

[57] ABSTRACT

An improved driver design including a plurality of NPN bipolar driver transistors connected in an H configuration including at least one bipolar upper drive transistor. A novel circuit is included for driving the upper NPN bipolar driver transistor. In a particular implementation, the circuit for driving the upper bipolar drive transistor is adapted to sense the output of the drive transistor and regulate a voltage at the input thereof in response thereto to keep the drive transistor out of saturation. Thus, power dissipation is minimized by using an H configuration and high speed is afforded by using bipolar drive transistors and by keeping the drive transistors out of saturation.

9 Claims, 2 Drawing Sheets

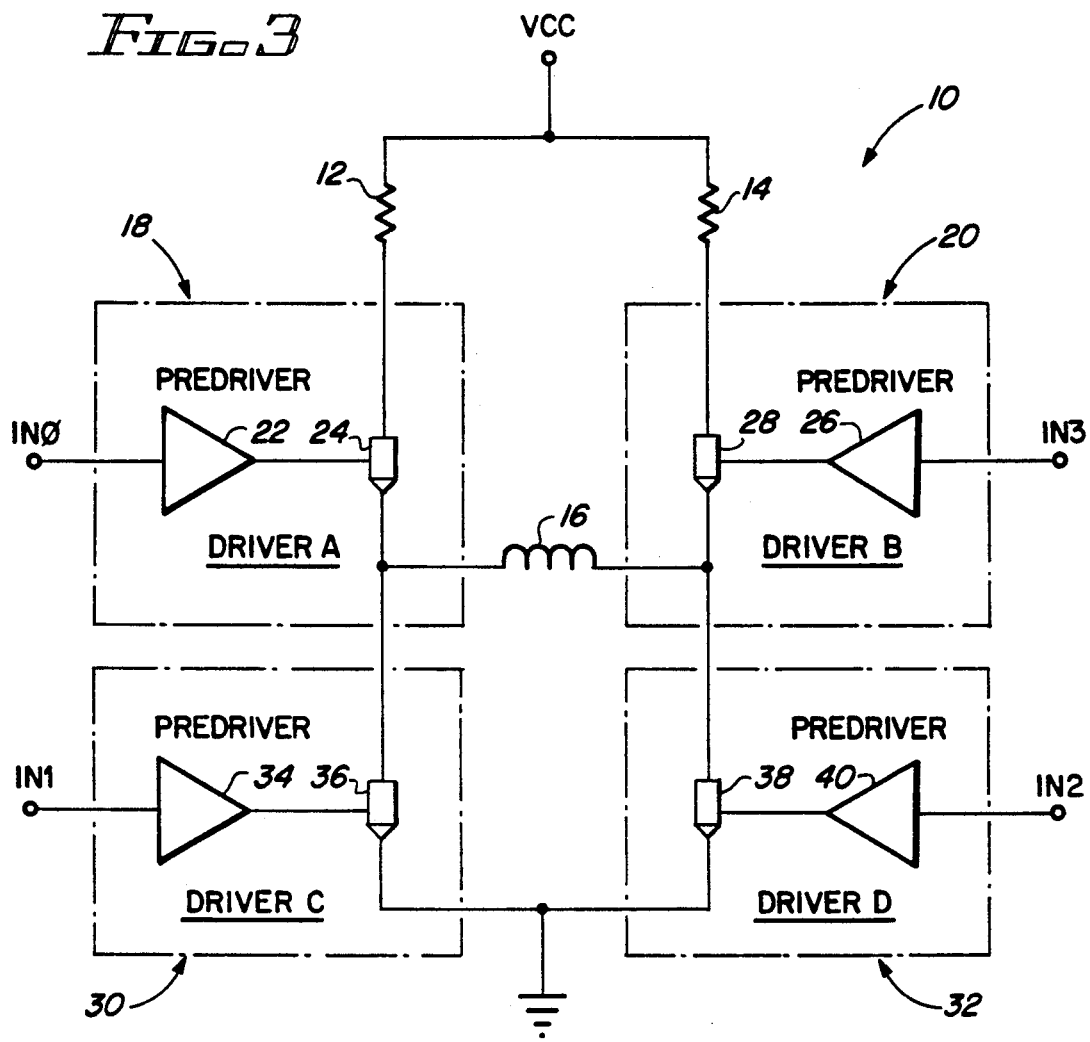
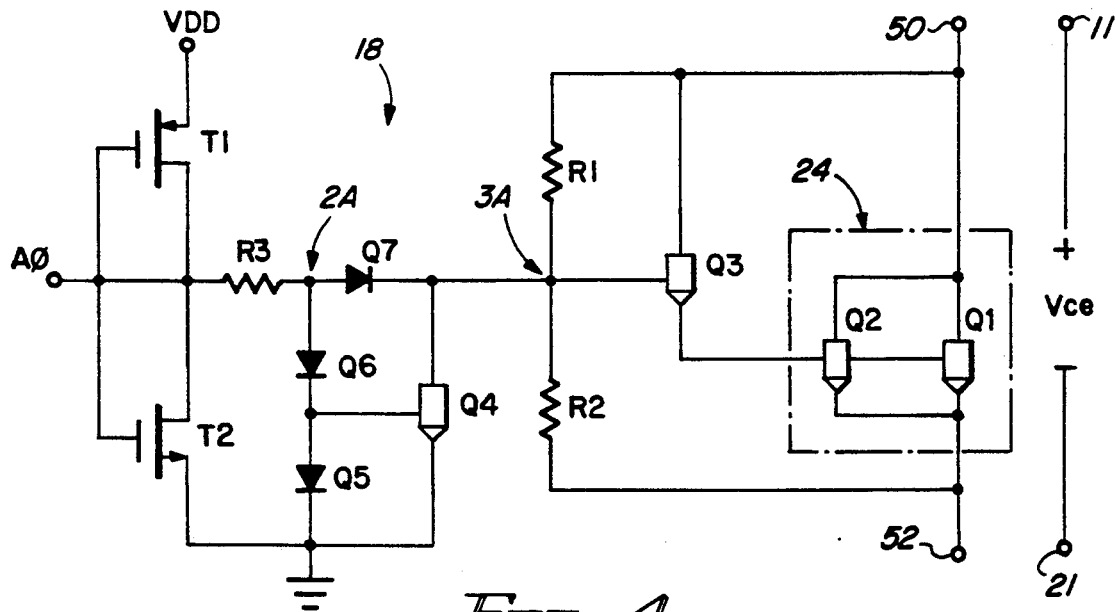

BIPOLAR H WRITE DRIVER

BACKGROUND OF THE INVENTION

1. Field of the Invention

The present invention relates to drive circuits. More specifically, the present invention relates to drive circuits used for write heads for tape recorders and the like.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

2. Description of the Related Art

In many circuits of a computing system, power dissipation is a significant concern. For example, in tape units, a need has been recognized recently for small tape products. However, in small tape units, little or no space is available for cooling fans. Pockets of thermal energy or hot spots are created which are deleterious to the circuitry of the unit. Hence, there has been an ongoing effort to reduce the power dissipated by the write driver circuits of small form factor tape units to minimize the heat generated thereby.

A conventional write driver uses open-collector type drivers to generate the write current pulse through the write head. Bidirectional write current pulses are generated by alternating the pulses to two bipolar write drivers. Each time a write pulse is sent to a write driver, the current through the write driver will be at least twice the current through the write head. This current is equal to the current through the resistors. While this approach is very fast, it dissipates a substantial amount of power.

An alternative design uses complementary metal-oxide semiconductor (CMOS) field effect transistors (FETs) in an H configuration. In this architecture, bidirectional current through the write head is controlled with alternating pulses through four FET devices. Power dissipation is half that of the above design. However, the parasitic capacitances of the FET devices cause the drivers to be significantly slower than the bipolar design above.

Thus, a need remains in the art for an improved write driver effective in small form factor applications. Specifically, there is a need in the art for a write driver design which utilizes the H configuration for lower power consumption and bipolar devices for faster switching.

SUMMARY OF THE INVENTION

The need in the art is addressed by the present invention which provides an improved driver design. The inventive driver includes a plurality of bipolar drive transistors connected in an H configuration including at least one bipolar upper drive transistor. A novel circuit is included for driving the upper bipolar drive transistor.

In a particular implementation, the circuit for driving the upper NPN bipolar drive transistor is adapted to sense the output of the drive transistor and regulate a voltage at the input thereof in response thereto to keep the drive transistor out of saturation.

Thus, power dissipation is minimized by using an H configuration and high speed is afforded by using bipolar drive transistors and by keeping the drive transistors out of saturation.

BRIEF DESCRIPTION OF THE DRAWINGS

FIG. 3 is a schematic diagram of the bipolar "H" write driver of the present invention.

FIG. 4 is a schematic diagram of an upper NPN driver of the write driver of the present invention.

DESCRIPTION OF THE INVENTION

Illustrative embodiments and exemplary applications will now be described with reference to the accompanying drawings to disclose the advantageous teachings of the present invention.

Figure 1:
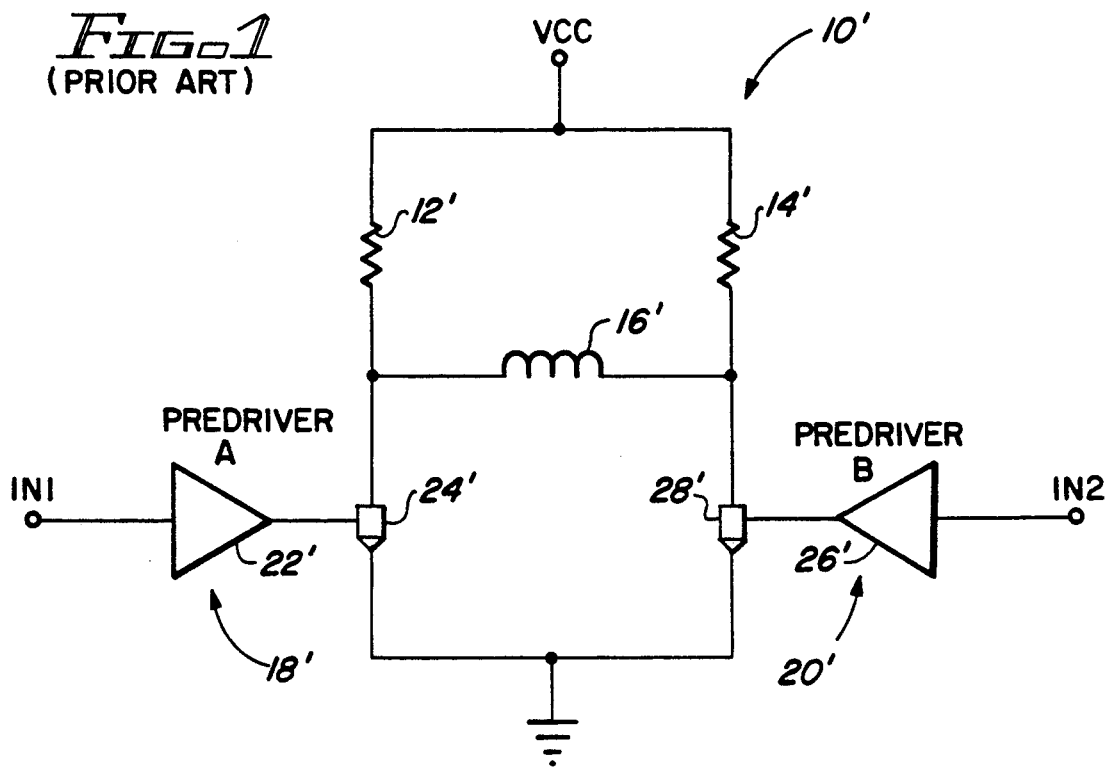
FIG. 1 is a schematic diagram of a bipolar write driver constructed in accordance with conventional teachings.

FIG. 1 is a schematic diagram of a bipolar write driver constructed in accordance with conventional teachings. The write driver 10' includes first and second write resistors 12' and 14', respectively, each of which is connected on one end to a source of supply $V_{CC}$. The second ends of the first and second resistors are connected to the first and second ends of a tape write head 16' (shown as a coil) respectively. First and second driver circuits 18' and 20' are connected to the first and second ends of the write head 16'. The first driver circuit 18' includes a pre-driver 22' and a first NPN transistor 24'. Similarly, the second driver 20' includes a second pre-driver 26' and a second NPN transistor 28'.

To write on the tape (not shown), the first driver is triggered by a pulse applied to the input terminal "IN1" thereof. The pre-driver is a buffer which turns on the transistor 24'. This draws current through the first write resistor 12' and the write head 16' and the second write resistor 14'. To write, current is caused to flow in the opposite direction through the write head 16' by the second driver 20'.

As mentioned above, each time a write pulse is sent to a write driver, the current through the write driver will be at least twice the current through the write head. This current is equal to the current through the resistors. While this design is very fast, it dissipates a substantial amount of power through the write resistors 12' and 14' and through NPN transistors 24' and 28'.

Figure 2:
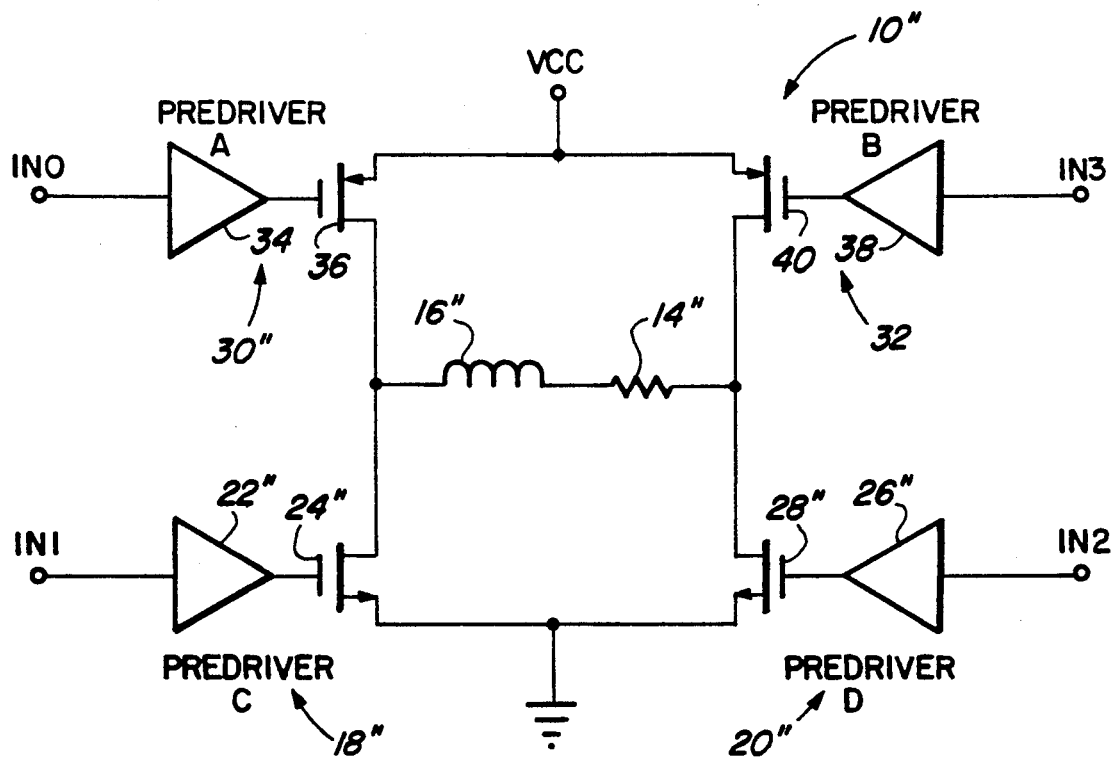
FIG. 2 is a schematic diagram of a CMOS "H" write driver architecture.

FIG. 2 is a schematic diagram of a CMOS "H" write driver architecture. In this design, the bipolar transistors 24' and 28' of FIG. 1 are replaced by N channel FET devices 24" and 28" respectively. In addition, the first and second write resistors 12' and 14' are replaced by third and fourth driver circuits 30" and 32", respectively. In actuality, the second write resistor 14" of FIG. 1 is moved to position shown in FIG. 2 in line with the write head 16". The third and fourth driver circuits 30" and 32" are identical to the first and second driver circuits 18" and 20"0 with the exception that the N channel FETs 24" and 28" are replaced with P channel FETs 36" and 40" respectively.

This H configuration offers lower-power dissipation because the current supplied by Vcc in FIG. 2 is ½ the current supplied by Vcc in FIG. 1, whereas the Vcc for both FIG. 1 and FIG. 3 is the same. In addition, the current through the third driver 30" is shut off when the first driver 18" is conducting and the current through the fourth driver 32" is shut off when the second driver 20" is conducting.

Unfortunately, as mentioned above, the parasitic capacitances of the FET devices cause the drivers to be significantly slower than the bipolar design of FIG. 1.

FIG. 3 is a schematic diagram of the bipolar "H" write driver of the present invention. The invention 10 includes first and second write resistors 12 and 14, each having a first end connected to a source of supply $V_{CC}$. The second end of the first write resistor 12 is connected to a first upper driver circuit 18 and the second end of the second write resistor 14 is connected to a second upper driver 20. Identical lower drivers 30 and 32 are included.

The operation of the write driver of the present invention is essentially the same as the designs of FIGS. 1 and 2. However, a significant novel aspect of the invention is the use of the advantageous low power consumption "H" configuration with fast bipolar transistors. In addition, the invention provides a unique, novel and advantageous design using NPN drive transistors exclusively. The desirability of an all NPN design has been recognized because of the performance differences between NPN and PNP devices; however, a teaching as to how to achieve a homogeneous design has heretofore been unavailable due to the difficulty in switching the NPN transistors without saturating same. Saturation of the transistors slows the response time.

The drivers 30 and 32 are of an identical design but not the same as that of drivers 18' and 20'. FIG. 4 is a schematic diagram of an upper NPN write driver of the write driver of the present invention. The bipolar drive transistor 24 of FIG. 3 comprises two bipolar NPN transistors Q1 and Q2 connected in parallel. The drive transistor 24 is driven by a third bipolar transistor Q3 which serves as a turn-on transistor. A first voltage divider comprised of two series-connected resistors R1 and R2 bias the third transistor Q3 at the node 3A therebetween. The node 3A is in the collector circuit of a fourth bipolar transistor Q4 which serves as a pulldown switch. Diodes Q5, Q6 and Q7 and the resistor R3 provide a second voltage divider circuit to bias the fourth transistor Q4. Also, the diode Q7 blocks current flow from node 3A to node 2A. Node 2A provides the output of an inverter comprising a P channel FET, T1, and an N channel FET, T2, connected between a source of supply $V_{DD}$ and ground. Input to the driver is provided by terminal A0 which is a normal CMOS logic signal.

The driver 18 appears as a fixed voltage source when the driver is active and a high impedance to current when it is disabled.

In operation, when a logic "high" level input (e.g. +5 volts) is applied to the input terminal A0, the output of the inverter consisting of transistors T1 and T2 will be low (0 volts). This low level will force the base of the NPN transistor Q4 to be near ground potential. This will turn off Q4 and no current will flow into the collector, node 3A, of the transistor Q4. Also, the diode Q7 will not allow current to flow from node 3A to node 2A when node 3A is biased above node 2A by 0.7 volts. This will allow node 3A to be biased by the voltage divider R1/R2. This, in turn, will allow current flow in transistor Q3 which will provide base current for transistors Q1 and Q2 to turn on the drive transistor 24 without saturation of same. The output voltage of the driver is the collector to emitter voltage $V_{CE}$ of the drive transistor 24 and is given by equation [1] below:

$$V_{CE}=(1+R1/R2)(V_{BE3}+V_{BE1}) \quad [1]$$

where $V_{BE3}$ is the base emitter voltage of the transistor Q3 and $V_{BE1}$ is the base emitter voltage of the transistors Q1 and Q2.

When the input to terminal A0 is low, the output of the T1/T2 inverter will be high, turning on Q4. The collector-emitter voltage of Q4 will be equal to one forward biased diode drop of 0.7 volt. This allows quick turn-off of Q4 when the input at A0 goes high. With the collector of transistor Q4 one diode drop above ground, node 3A is so low in potential that Q3 and Q1/Q2 are turned off and a high impedance exists between terminals 50 and 52.

Ordinarily, the energy stored in the inductive write head 16 of FIG. 3 would saturate the drive transistor 24. However, in accordance with the teachings of the present invention, the resistor R2 of the drivers (FIG. 4) feeds voltage from the write head 16 back to the base of Q3, thereby stabilizing the output of Q1 and Q2 and keeping the drive transistor 24 out of saturation.

Thus, the present invention has been described herein with reference to a particular embodiment for a particular application. Those having ordinary skill in the art and access to the present teachings will recognize additional modifications, applications and embodiments within the scope thereof. For example, the invention is not limited to use with tape write units. The invention may be used with other circuits as well.

It is therefore intended by the appended claims to cover any and all such applications, modifications and embodiments within the scope of the present invention. Accordingly,

What is claimed is:

1. A driver circuit comprising:
   first and second parallel paths connected between a first node and a second node;
   a third node in said first path and a fourth node in said second path for connecting a load therebetween;
   a first bipolar drive transistor in said first path connected between said first node and said third node;
   a second bipolar drive transistor in said second path connected between said first node and said fourth node;
   a third bipolar drive transistor in said first path connected between said third node and said second node;
   a fourth bipolar drive transistor in said fourth path between said fourth node and said second node;
   a bipolar turnon transistor having a collector terminal connected to said first node and an emitter terminal connected to an input to said one of said drive transistors; and
   means for stabilizing the output of said one of said drive transistors, said stabilizing means including feedback means connected between the output of said one of said drive transistors and an input of said turnon transistor.

2. The invention of claim 1 wherein said feedback means is a first resistor.

3. The invention of claim 2 wherein said driver circuit further includes a voltage divider circuit including said first resistor and a second resistor connected between said input of said turnon transistor and said first node.

4. The invention of claim 3 wherein said driver circuit further includes a bipolar pulldown transistor connected between the input of said turnon transistor said second node.

5. The invention of claim 4 wherein said pulldown transistor has a collector terminal connected to the input of said turnon transistor and an emitter terminal connected to said second node.

6. The invention of claim 5 wherein said first, second, third and fourth bipolar drive transistors, said turnon transistor and said pulldown transistor are NPN type transistors.

7. The invention of claim 5 further including a second voltage divider circuit connected to the input of said pulldown transistor.

8. The invention of claim 7 further including an inverter connected to the input of said second voltage divider.

9. A driver circuit comprising:
   first and second parallel paths connected between a first node and a second node;
   a third node in said first path and a fourth node in said second path for connecting a load therebetween;
   a first bipolar drive transistor in said first path connected between said first node and said third node;
   a second bipolar drive transistor in said second path connected between said first node and said fourth node;
   a third bipolar drive transistor in said first path connected between said third node and said second node;
   a fourth bipolar drive transistor in said fourth path between said fourth node and said second node; and
   a predriver circuit connected to the input of at least one of said drive transistors, said predriver circuit including:
     a bipolar turnon transistor having a collector terminal connected to said first node and an emitter terminal connected to an input to said one of said drive transistors,
     feedback means connected between the output of said one of said drive transistors and an input of said turnon transistor, and
     a bipolar pulldown transistor connected between the input of said turnon transistor and said second node, said pulldown transistor having a collector terminal connected to the input of said turnon transistor and an emitter terminal connected to said second node.

* * * * *